United States Patent [19]

Kumagai et al.

[11] Patent Number: 5,593,556
[45] Date of Patent: Jan. 14, 1997

[54] HIGHLY DURABLE ELECTRODES FOR ELECTROLYSIS AND A METHOD FOR PREPARATION THEREOF

[75] Inventors: Naokazu Kumagai, Matsudo; Shuji Jikihara, Noda; Yoshimitsu Samata, Kashiwa, all of Japan

[73] Assignee: Daiki Engineering Co., Ltd., Tokyo, Japan

[21] Appl. No.: 384,691

[22] Filed: Feb. 6, 1995

Related U.S. Application Data

[63] Continuation of Ser. No. 133,371, Oct. 8, 1993, abandoned.

[30] Foreign Application Priority Data

Oct. 14, 1992 [JP] Japan ................................ 4-275896
Apr. 28, 1993 [JP] Japan ................................ 5-102450

[51] Int. Cl.$^6$ ........................................................ C25B 11/00
[52] U.S. Cl. ................................. 204/290 F; 204/290 R; 204/192.15; 427/77; 427/123; 427/126.5; 427/309; 427/328; 427/372.2; 427/376.2; 427/376.4
[58] Field of Search .................... 204/290 F, 192.5, 204/290 R; 427/77.123, 126.5, 309, 328, 372.2, 376.2, 376.4

[56] References Cited

U.S. PATENT DOCUMENTS

| | | | |
|---|---|---|---|
| 4,468,416 | 8/1984 | Asano et al. | 427/126.5 |
| 4,471,006 | 9/1984 | Asano et al. | 427/126.3 |
| 4,484,999 | 11/1984 | Asano et al. | 204/290 R |
| 4,502,936 | 3/1985 | Hayfield | 204/290 F |
| 4,964,967 | 10/1990 | Hashimoto et al. | 204/292 |
| 5,019,224 | 5/1991 | Denton et al. | 204/290 F |
| 5,059,297 | 10/1991 | Hirao et al. | 204/290 F |
| 5,156,726 | 10/1992 | Nakada et al. | 204/290 F |

OTHER PUBLICATIONS

Powder Diffraction File JCPDS Cards 4–0788 (1961) and 19–1290 (1965) w/explanatory document entitled "Powder Diffraction File Organic Phases Search Manual", 1984.
Proceedings of the Symposium on Corrosion, Electrochemistry, And Catalysis of Metastable Metals and Intermetallics, vol. 93–30 (1993) No Month Available.

*Primary Examiner*—Bruce F. Bell
*Attorney, Agent, or Firm*—Larson & Taylor

[57] ABSTRACT

The present invention provides highly durable electrodes for electrolysis, which are platinum group metal oxide-coated or composite oxide-coated Ti electrodes, comprising a sputtered film of a metal or an alloy consisting of at least one selected from the group of Ti, Zr, Nb and Ta to be transformed the metastable $\beta$ phase to the $\alpha$ phase in crystal structure by the heat treatment to prepare the active layer carried on the surface, as an intermediate layer at the interface between Ti substrate and electrocatalytic active layer, and method for preparation thereof. The electrodes allow stable electrolysis at low electrode potentials for long periods of time as highly durable electrodes for electrolysis, especially electrodes for oxygen evolution at high current density.

8 Claims, 7 Drawing Sheets

FIG. 4(b) 10μm

HIGHLY DURABLE ELECTRODES FOR ELECTROLYSIS AND A METHOD FOR PREPARATION THEREOF

This application is a continuation of application Ser. No. 8/133,371 filed Oct. 8, 1993, now abandoned.

FIELD OF THE INVENTION

The present invention relates to highly durable electrodes for electrolysis, above all, electrodes with excellent durability and high electrocatalytic activity for oxygen evolution in the electrolysis of sulfate and other various aqueous solutions, and to the method for preparation thereof.

PRIOR ART

In the electrolysis of electrolytes in sulfate baths, lead alloys are widely used as insoluble anodes for oxygen evolution. Among the lead alloys, Pb-Ag alloy with 1 wt % of silver added to lead is known most, and since it was devised by Taiton in 1929, it is called the Taiton anode and widely used for electrowinning zinc from a zinc sulfate bath. Furthermore, lead alloy electrodes are used also as anodes in the production of copper foils as well as for various kinds of plating, and are typical insoluble anodes for the electrolysis of sulfate baths.

From the latter half of 1970s to the middle of 1980s, R&D was conducted actively on the plating processes by operation at high current densities, as a mass production technology for zinc-plated steel sheets. As a result, a plating process to allow operation at a high current density of 150 A/dm$^2$, 50 times higher than the operating current density of electrowinning of zinc, etc. was developed. However, if conventional Pb-Ag alloy electrodes are used in this process, Pb is heavily dissolved. To improve the poor durability, various lead alloy electrodes were proposed (Japanese Patent Laid-Open Nos. 89-25998, 85-26635, 84-173297, etc.), but even the improved lead alloy electrodes cannot avoid, more or less, that the lead is dissolved into the electrolyte, to contaminate it. In this case, it is practiced to add an apparatus for precipitating and removing the lead ions in the electrolyte using strontium carbonate, to the plating process line. In addition, lead alloy electrodes are high in oxygen overvoltage, to present a problem of large energy loss. Any energy-saving, highly durable and insoluble anodes to substitute the lead alloy electrodes are being demanded to be developed.

Platinum group metal oxide-coated Ti electrodes and platinum group metal composite oxide-coated Ti electrodes are widely used as electrodes for chlorine evolution in sodium chloride aqueous solution electrolysis for production of caustic soda, etc., and it is attempted to apply these electrodes to the plating processes by operation at high current densities.

However, it is known that the Ti electrodes coated with oxides of ruthenium and titanium and electrodes coated with oxides of ruthenium and tin respectively widely used in the caustic soda producing electrolysis cannot be used in the sulfate bath electrolytes for said plating processes, since ruthenium oxides as an active electrode material are poor in corrosion resistance. For oxygen evolution in the sulfate bath electrolytes, iridium oxide-coated Ti electrodes are considered to be promising, since iridium oxide is most excellent in corrosion resistance among the platinum group metal oxides used as active electrode materials. For example, Takahashi, et al. of Yokohama National University experimentally electrolyzed 2N sulfuric acid as an electrolyte at 40° C. at 1 A/cm$^2$, to measure the corrosion weight losses of platinum group metals and platinum group metal oxides. According to the results, among platinum group metals, platinum was most excellent in corrosion resistance, being reported to be 5.0 μg/cm$^2$·Ah in the weight loss per unit time, and among platinum group metal oxides, iridium oxide (IrO$_2$) was most excellent, being reported to be 0.1 μg/cm$^2$·Ah. Therefore, a Ti electrode carrying iridium oxide by 20 g/m$^2$ as metal should be able to endure the electrolysis for 20,000 hours even at a high current density of 1 A/cm$^2$ (100 A/dm$^2$).

However, if an iridium oxide-coated Ti electrode is used as an electrode to generate oxygen in an environment not containing any chlorine ion such as a sulfuric acid solution, a titanium oxide layer grows at the interface between the Ti substrate and the active coating layer, and according to the growth of titanium oxide layer, the electrode potential rises, not allowing energization in only about 1000 hours. Iridium oxide does not pose any problem in view of corrosion resistance as an electrocatalyst, but the problem at the interface between iridium oxide and Ti does not allow the iridium oxide-coated Ti electrode to be practically used.

To inhibit the growth of titanium oxide at the interface, several methods are proposed to form a proper intermediate layer at the interface between the active layer and Ti (Japanese Patent Publication Nos. 91-27635, 85-21232 and 85-22074 and Japanese Patent Laid-Open No. 82-116786). In these methods, a compound to be used as the intermediate layer is dissolved into a proper solvent, and the solution is painted onto the Ti substrate, dried and baked.

Examples of Japanese Patent Publication Nos. 85-21232 and 85-22074 disclose that the intermediate layer is formed by painting 10% tantalum pentachloride hydrochloric acid aqueous solution or a hydrochloric acid solution containing tantalum chloride and titanium chloride, drying and baking. An example of Japanese Patent Publication No. 91-27635 discloses that the intermediate layer is formed by painting a solution with chloroiridic acid (H$_2$IrCl$_6$·6H$_2$O) and tantalum butoxide (Ta(OC$_4$H$_9$)$_5$) dissolved in butanol, drying and baking. All of these conventional intermediate layers are oxide layers prepared by painting, drying and baking. The method of painting Ti substrate on its surface with a solution containing a proper material, drying and baking is called the thermal decomposition method which is also used for producing platinum group metal oxide-coated Ti electrodes or platinum group metal compound oxide-coated Ti electrodes. The intermediate layer to be formed at the interface between the active coating layer and Ti substrate for inhibiting the growth of titanium oxide at the interface must be a compact protective film. However, any intermediate layer formed by the thermal decomposition method has a disadvantage that it is poor in compactness as a protective film to inhibit the growth of titanium oxide. The reasons are that when the material of the intermediate layer dissolved in a solvent is dried in the thermal decomposition method, the vaporization of the solvent causes volume contraction, and that also when a chloride or metal alkoxide is decomposed to produce the corresponding oxide by heat treatment, the reaction causes volume contraction, for generating such defects as cracks in the intermediate layer expected to act as a protective layer. Therefore, even if an intermediate layer is formed by such a method, the electrolyte permeates through the defects such as cracks, to make titanium oxide grow at the interface between the intermediate layer and Ti substrate. As a result, the electrode becomes unable to sustain energization, sooner or later, before the active coating layer on the surface is consumed.

The oxide intermediate layer not containing any active electrode material as proposed in Japanese Patent Publication No. 85-2132 or 85-22074 acts as a large resistance in the electrolysis at a high current density, to raise the voltage of the electrolytic cell as another disadvantage.

On the other hand, one of the present inventors devised amorphous alloy electrodes produced by using an electron beam, etc. (U.S. Pat. No. 1646113), which are quite different in type from Ti electrodes produced by the conventional thermal decomposition method. The process for producing the electrodes comprises the steps of covering Ti base on its surface with an alloy composed of Ni, valve metals and platinum group metals, irradiating the entire surface by scanning an electron beam, for making the covering surface alloy layer amorphous, and immersing it into hydrofluoric acid, for selectively dissolving Ni and valve metals in the outermost surface layer, for surface activation. In the outermost surface layer of the electrode produced like this, the constituent elements on the surface other than platinum group metals are selectively dissolved by hydrofluoric acid, to concentrate platinum group metals on the surface, and in addition, an active layer very large in effective electrode area is formed. As a result, the electrodes prepared based on U.S. Pat. No. 1646113 have a structure of active layer/amorphous alloy layer/Ti substrate, with the amorphous alloy layer formed as an intermediate layer at the interface between the active layer and Ti substrate. The inventors comparatively tested these electrodes with said structure and the platinum group oxide-coated Ti electrodes and platinum group metal composite oxide-coated Ti electrodes prepared by the conventional thermal decomposition method, by effecting electrolysis in an environment as adopted for electrowinning of zinc, i.e., in 3N sulfuric acid electrolyte at 40° C. at 5 A/dm$^2$. As a result, the Ti electrodes prepared according to the conventional thermal decomposition method gradually rose in electrode potential with the lapse of time, but the electrodes prepared based on U.S. Pat. No. 1646113 almost leveled off stably in electrode potential with the lapse of time. The inventors interpreted that the better performance is attributable to the intermediate layer not of oxide but of metals existing in the electrodes prepared based on U.S. Pat. No. 1646113. However, the electrodes according to U.S. Pat. No. 1646113 were relative short in life, when used as oxygen generation electrodes in high current density operation as adopted in the zinc plated steel plate process.

The concept to form an amorphous alloy layer at the interface between an active layer and Ti substrate can also be seen in Japanese Patent Kokai No. 90-247393. The patent application proposes "electrodes for electrolysis, comprising a metallic base, an amorphous layer free from grain boundary formed on the surface of the base, and an active electrode material covering it" and "a process for preparing electrodes for electrolysis, comprising the steps of forming an amorphous layer free from grain boundary on the surface of a metallic substrate by vacuum sputtering, and covering it with an electrocatalyst". Furthermore, the patent application defines the amorphous structure and constituent elements of the intermediate layer in the electrodes for electrolysis, stating "the amorphous layer is composed of a metal selected from Ti, Ta, Nb, Zr and Hf or any of their alloys".

When an amorphous layer with a valve metal such as Ti, Zr, Nb and Ta as a constituent element is formed by PVD (Physical Vapor Deposition) such as sputtering, a thin single-metal film with amorphous structure cannot be obtained unless the temperature of the substrate is kept at lower than the crystallization temperature of the metal. Usually, the crystallization temperature of a single metal is lower than room temperature, and if the substrate temperature can be kept lower than room temperature, the thin single-metal film formed can have amorphous structure. However, from practical aspect, the amorphous structure should be kept at room temperature, and in this case an alloy composed of two or more metals is required. The reason is that in general, the crystallization temperature of an alloy is very higher than those of the constituent metals. If an alloy composition with a crystallization temperature higher than room temperature is selected, the thin alloy film obtained by sputtering has amorphous structure even at room temperature.

However, keeping amorphous structure at room temperatures requires alloying with another metal, and unless a proper composition is selected, the alloying may, on the contrary, lower the corrosion resistance of the intermediate layer of the electrode in the electrolysis at a high current density. The metals which may be excellent in corrosion resistance for use as the intermediate layer in a very oxidative atmosphere as in high current density electrolysis are platinum group metals and valve metals only. The use of platinum group metals as the intermediate layer is very expensive and uneconomical. Especially for electrodes for oxygen evolution, iridium oxide is most excellent in corrosion resistance, and so even if platinum group metals less resistant against corrosion than iridium oxide are used as the intermediate layer for iridium oxide acting as the active surface layer excellent in corrosion resistance, no large effect can be expected. On the other hand, even though valve metals are excellent in corrosion resistance, they cause a phenomenon that valve metal oxides grow to achieve insulation at the interface between the active layer and the intermediate layer made of valve metals, like the electrodes with the active electrode material directly carried on the surface of Ti base.

For example, also as described in the comparative example stated in Example 1, when an iridium oxide/intermediate Ti-sputtered film layer/Ti base electrode, in which iridium oxide was carried on the surface of a Ti-sputtered film formed as an intermediate layer on Ti substrate was tested in the electrolysis at a high current density, to see its durability, it did not allow electrolysis already 1000 hours later. In this case, the amount of Ir remaining on the surface of the electrode unable to sustain electrolysis any more was 80%, to suggest that the impossibility of further electrolysis was caused, not by the consumption of iridium oxide, but by the insulation achieved by the growth of titanium oxide at the interface between iridium oxide and the Ti-sputtered film formed as the intermediate layer. To use valve metals as the intermediate layer for preparing an oxygen evolution electrode excellently durable in the electrolysis at a high current density, the growth of the oxide must be prevented.

MEANS FOR SOLVING THE PROBLEM

To solve the problem of valve metal oxide growth, the inventors diffused platinum group elements into valve metals, for examining how to ease the insulation by the growing oxides or how to inhibit the growth of the oxides.

Both valve metals and platinum group metals are high in melting point, and to diffuse a platinum group metal into a valve metal, heat treatment at a very high temperature is required. However, since iridium oxide possessing a high electrocatalytic activity for oxygen evolution is decomposed at higher than 800° C., heat diffusion treatment at such a high temperature cannot be effected. The inventors thought that the problem can be solved if the dynamic migration of atoms as a change of crystal structure occurs in the valve metal formed as the intermediate layer at the low temperature (350° to 550° C.) adopted to make iridium oxide carried.

Respective valve metals being used as targets, sputtered films were formed on the surface of Ti substrate without cooling the substrate temperature to lower than room temperature, and their crystal structures were examined. The structures of Ti and Zr were of hexagonal closed packing (hcp), and that of Nb was of body centered cubic (bcc). On the contrary, a Ta-sputtered film showed a crystal structure containing $\beta$ phase. What is important here is that the other valve metals than Ta show the same crystal structures as those of ordinary bulk metals, and that the crystal structure of Ta-sputtered film is different from those of bulk metals. When Ta is an ordinary bulk metal, it has bcc structure like Nb, which is called $\alpha$ phase. From a thermodynamic viewpoint, phase is thermodynamically stable phase, and $\beta$ phase is thermodynamically metastable phase. This means that $\beta$ phase as thermodynamically metastable phase transforms structurally into stable phase if heated at a certain temperature. Furthermore, the inventors comfirmed that $\beta$ phase changes structurally into $\alpha$ phase at a low temperature of 450° C., and using this structural change, devised an electrode with a structure of iridium oxide/Ir diffused layer/intermediate Ta-sputtered layer/Ti substrate.

The inventors paid attention to the peculiarity that a Ta-sputtered film has a crystal structure different from those of bulk metals, unlike the other valve metals (Ti, Zr and Nb) and furthermore found that the peculiar crystal structure changes at the temperature of heat treatment effected for making the active electrode material carried. Based on this finding, they found a method of diffusing the active electrode material into the intermediate layer by using this structural change. Thus, the present invention has been achieved.

Metals such as Ti and Zr have hcp structure at room temperature which is transformed into bcc structure in a high temperature range (Ti: 882° C., Zr: 863° C.). The temperature at which the transformation from hcp structure to bcc structure occurs is called a transformation point. It is known that the transformation point is lowered in alloys prepared by adding such elements as Mo, Nb, Ta, V, Ag, Co, Cr, Cu, Fe, Mn, Ni, Pb, Si and W. Therefore, if these elements are added to Ti or Zr to lower the transformation point, Ti alloys or Zr alloys with bcc structure ($\beta$ phase) can be prepared by the sputtering capable of making quenched structure. Thus, even though metals such as Ti, Zr and Nb cannot be made to have metastable phase by sputtering, those metals in combination with other metals can be made to have metastable phase. Therefore, as in the result obtained with the Ta-sputtered film, a diffused layer can be prepared by using the structural change from $\beta$ phase to $\alpha$ phase.

The technical idea of the present invention is to prepare electrodes allowing electrolysis stably for longer periods of time at low electrode potentials as electrodes for oxygen evolution at high current densities, by making an active electrode material carried on the surface of Ti base covered with a thin metal film of an excellently corrosion resistant valve metal containing metastable $\beta$ phase, to change the crystal structure of the thin metal film by the temperature of heat treatment effected to make the electrocatalytically active material carried, and to form a layer with the active electrode material diffused at the interface immediately below the active layer for preventing the growth of titanium oxide at the interface.

SUMMARY OF THE INVENTION

The present invention aims to provide energy-saving and highly durable electrodes for electrolysis, and provide a production process thereof.

(1) Highly durable electrodes for electrolysis, which are platinum group metal oxide-coated Ti electrodes or composite oxide-coated Ti electrodes, comprising a sputtered metal or alloy film consisting of at least one element selected from the group of Ti, Zr, Nb, and Ta as the intermediate layer at the interface between the Ti substrate and the electrocatalytically active coating layer.

(2) Highly durable electrodes for electrolysis, according to claim 1, wherein said sputtered film as the intermediate layer is a multi-layer film.

(3) Highly durable electrodes for electrolysis, according to claim 1, wherein the Ti substrate is treated on the surface by concentrated hot sulfuric acid, to be finely undulating on the surface, and is subsequently coated with said intermediate layer.

(4) Highly durable electrodes for electrolysis, which are platinum group metal oxide-coated Ti electrodes or composite oxide-coated Ti electrodes, comprising a Ta-sputtered film as an intermediate layer at the interface between the Ti substrate and the electrocatalytically active coating layer, to provide a structure of the active layer/layer with the platinum group metal(s) diffused in Ta/Ta-sputtered layer/Ti substrate.

(5) Highly durable electrodes for electrolysis, according to claim 4, wherein the crystal structure of said intermediate layer contains the metastable $\beta$ phase of tantalum in the stage before the preparation of the active layer is carried out.

(6) Highly durable electrodes for electrolysis, which are platinum group metal oxide-coated Ti electrodes or composite oxide-coated Ti electrodes, comprising a metal or an alloy film consisting of at least one element selected from the group of Ti, Zr, Nb, and Ta to be transformed from the metastable $\beta$ phase to the phase in crystal structure by the heat treatment to prepare the active layer on the surface, being coated on the surface of Ti substrate, and a diffused layer with the platinum group metal(s) in a part of the film, being formed at the interface between the film and the active coating layer by the heat treatment.

(7) A process for preparing a highly durable electrode for electrolysis, comprising the steps of coating a Ti substrate on its surface with a metal or an alloy film consisting of at least one element selected from the group of Ti, Zr, Nb, and Ta containg the metastable $\beta$ phase; coating the surface with the active materials; and forming a diffused layer with the platinum group metal(s) in a part of the film at the interface between the film and the active coating layer by using the transformation of crystal structure caused by the heat treatment effected to prepare the active coating layer carried on the surface.

OBJECTS AND ADVANTAGES

The present invention provides platinum group metal oxide-coated Ti electrodes or composite oxide-coated Ti electrodes allowing electrolysis stably at low electrode potentials for long periods of time as electrodes for oxygen evolution at high current densities, by making an electrocatalytic active layer carried on the surface of Ti substrate covered with a thin Ta metal film containing β phase, and changing the crystal structure of the thin Ta film by the temperature of heat treatment effected for making the active layer carried, to form a layer with the active layer diffused at the interface immediate below the active layer, for preventing the growth of titanium oxide at the interface.

DETAILED DESCRIPTION OF PREFERRED EMBODIMENT

Figure 1:
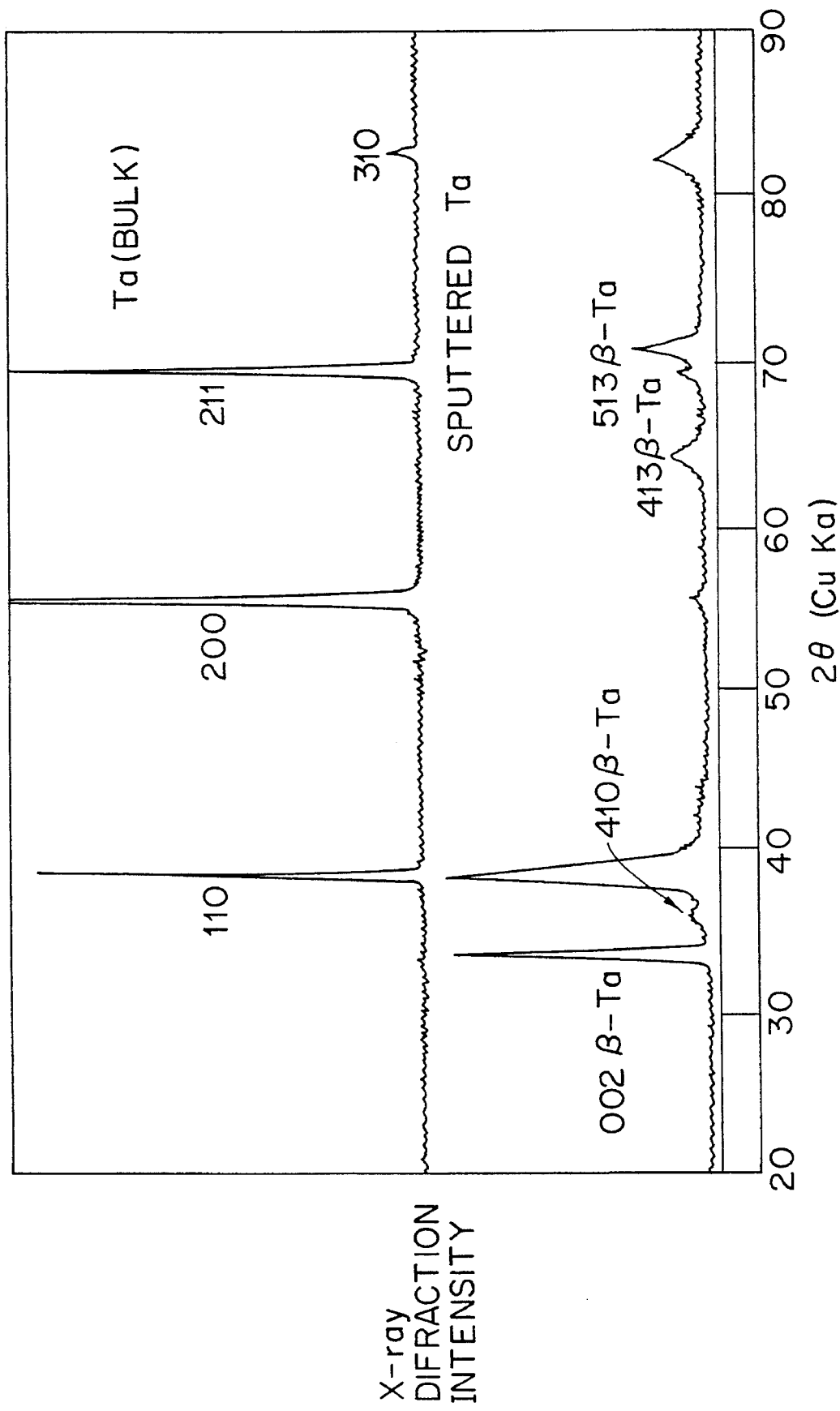
FIG. 1. X-ray diffraction patterns showing the difference in crystal structure between bulk metal Ta and Ta-sputtered film.

In the present invention, the material of the intermediate layer is limited to one metal or an alloy consisting of two or more metals selected from Ti, Zr, Nb and Ta to be sputtered to form a film, since they are materials with the corrosion resistance required as electrodes for electrolysis, and, as described before, the film of those metals with other metals can be made to have metastable β phase by sputtring. However, an iron family transition metal can be contained up to 15 wt. % for use as the intermediate layer without any problem. Among the iron family transition metals, Ni is most excellent, and an intermediate layer containing up to 33 wt. % of Ni is equivalent incapability to an intermediate layer not containing Ni.

Furthermore, the reason why the material of the intermediate layer in the present invention is limited to the Ta-sputtered film is, as described before, that it forms thermodynamically metastable β phase and changes structurally to stable α phase by the heat treatment effected to make electrocatalyst carried. The crystal structure of the sputtered film depends on the sputtering conditions (argon gas pressure, energy applied to the target, target-substrate distance, kind of substrate, surface treatment of substrate, effect of impurity gas in argon atmosphere during sputtering, etc.). Since the structural change is liable to occur with a mixed phase of α+β rather than β phase alone, making the mixed phase is desirable. The thin Ta film containing β phase can also be obtained by any other physical vapor deposition method such as vacuum evaporation, ion plating or ion beam, etc.

To make the electrocatalyst carried in the present invention, it is preferable to use the conventional thermal decomposition method. As for the relation between the intermediate layer and the active electrode material in the present invention, the use of iridium oxide is most preferable for oxygen evolution electrodes for the electrolysis in sulfate baths.

Furthermore, in the present invention, the sputtered film as the intermediate layer should be a multi-layer film, since compressive stress exists as residual stress in the Ta-sputtered film. The structural change caused by making the active electrode material carried strains the electrode plate. Especially in the case of electrodes for zinc plated steel sheet and copper foil production processes, the flatness of the electrode surface is a very important. Therefore, a strained electrode is not preferable for these processes. If the sputtered film is a multi-layer film, sliding occurs between respective layers, and the strain caused by the heat treatment effected for making the active electrode material carried can be negligibly very small. A sputtered multi-layer film can be formed by letting the substrate pass in front of the target at an optional speed at an optional frequency for sputtering.

The transformation of the crystal structure stated in the present invention can be identified by observing an X-ray diffraction. However, in this case, the confirmation on the existence of a phase containing β must be made before the electrocatalyst is carried. The reason is, of course, that even if the electrode covered with the active layer is inspected, the crystal structure of the intermediate layer cannot be observed, being blocked by the active layer on the surface, and that even if the active layer on the surface is mechanically removed, the structure has been changed from β phase to α phase by the heat treatment effected for making the active layer carried.

Figure 2:
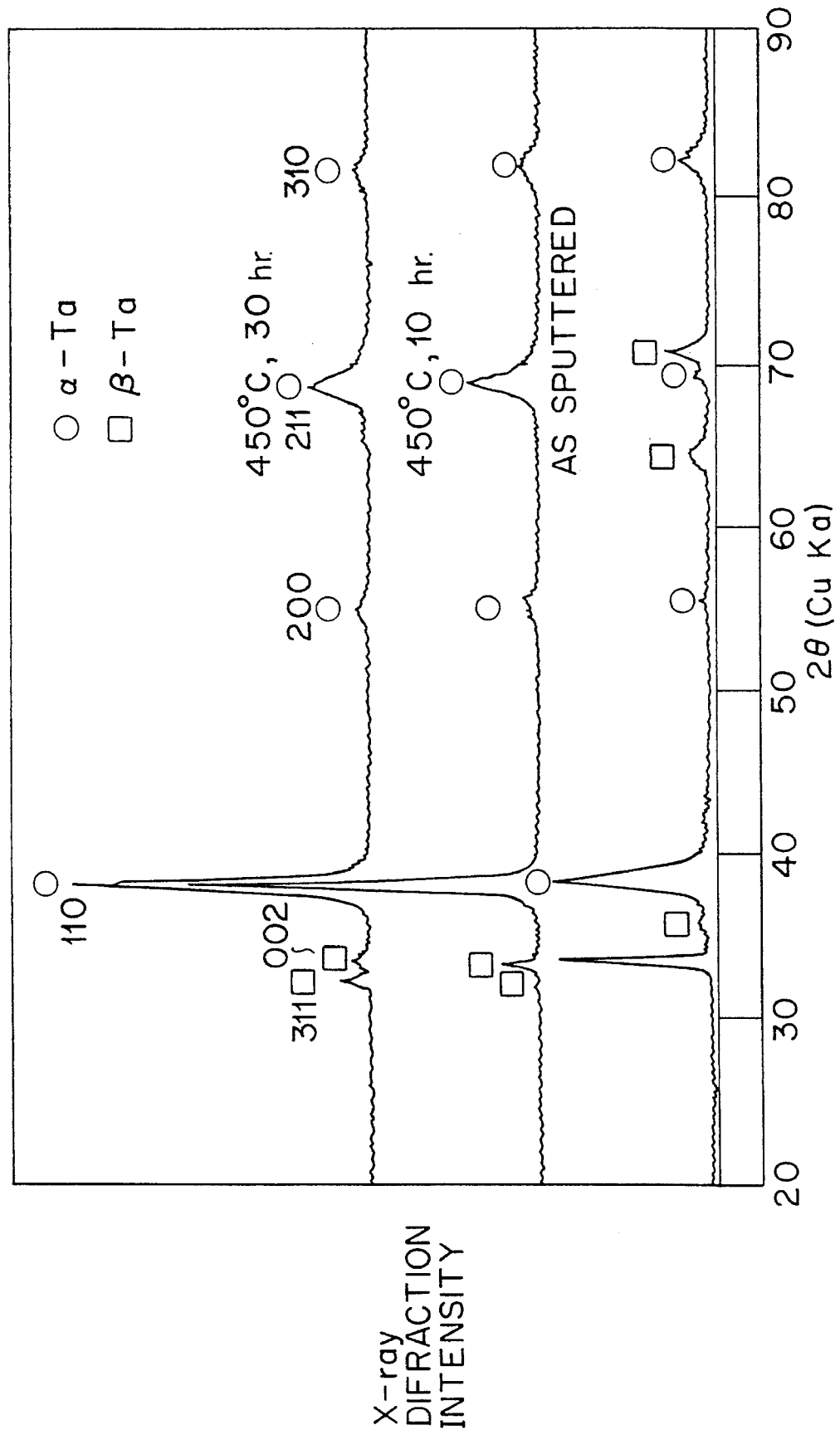
FIG. 2. X-ray diffraction patterns showing the change in crystal structure from β phase to α phase of a Ta-sputtered film with a mixed phase of α+β by heat treatment at 450° C.
Figure 3:
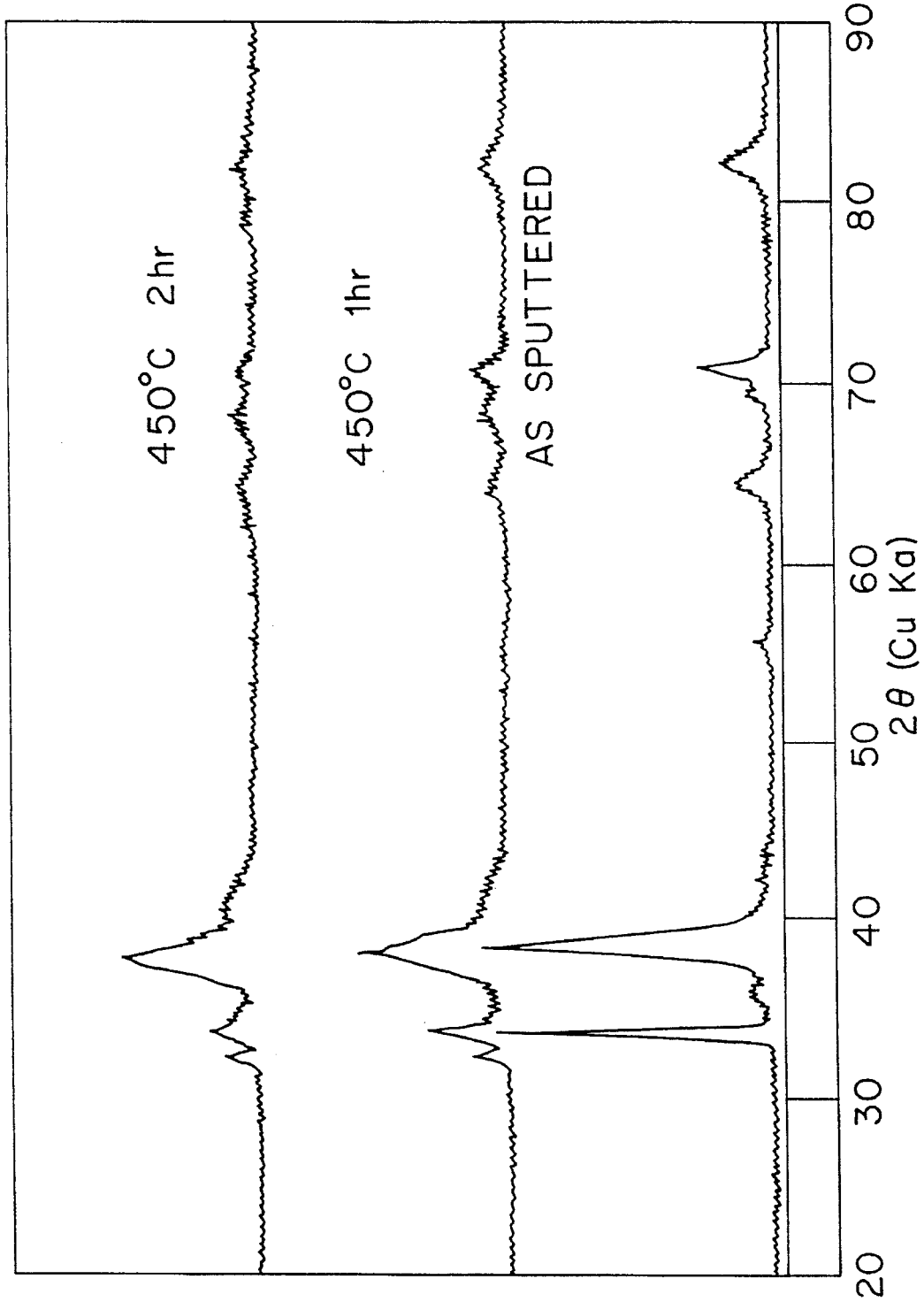
FIG. 3. X-ray diffraction patterns showing that the structural change from β phase to phase causes Ir diffusion to form an alloy layer at the interface.

An X-ray diffraction pattern showing the surface of a Ta-sputtered film and an X-ray diffraction pattern showing the surface of ordinary Ta bulk metal are comparatively shown in FIG. 1. As can be seen from these patterns, the Ta bulk metal prepared by ordinary melting and solidification has Ta of phase with bcc structure as the crystal structure, while the Ta-sputtered film shows a mixed phase of α+β. If the Ta-sputtered film is heat-treated at the temperature (450° C.) for making iridium oxide carried, the 002 reflection peak of β phase in FIG. 2 greatly decrases, and on the contrary, the 110 refection peak of α phase increases. This means that the crystal structure in the-sputtered film has transformed from β phase to α phase at a temperature of 450° C. FIG. 2 shows that the crystal structure of the Ta-sputtered film transforms at the temperature of heat treatment in the state that iridium oxide as the active layer is not yet carried on the surface. If iridium oxide exists as the active layer on the surface, the structural change causes an iridium-diffused layer at the interface between iridium oxide and the Ta-sputtered film. For example, if the surface of a sputtered layer carrying iridium with a thickness so thin as to allow the transmission of X-rays is observed by an X-ray diffraction pattern, a diffraction pattern expressing the Ir diffused and alloyed with the structural change from β phase to α phase can be seen as shown in the X-ray diffraction pattern, of FIG. 3, instead of the simple structural change shown in FIG. 2.

Figure 4A:
FIG. 4. Difference in the surface apearance of sputtered Ta layers on Ti substrate with the surface treatment by immersion in concentrated hot sulfuric acid (a) and without the treatment (b).
Figure 4A:

The reason why the Ti substrate is treated on the surface by concentrated hot sulfuric acid, to be finely undulating on the surface in the present invention is that a different surface morphology can be obtained on the sputter-deposited film. A photo showing the surface of a sputter-deposited film on the Ti substrate treated on the surface by concentrated hot sulfuric acid and a photo showing that on the Ti substrate not treated are shown in FIG. 4. As can be seen from the photos, the surface-treated Ti substrate presents a surface larger in area and more suitable for being coated with an electrocatalyst.

Example 1

The surface of 120×200×2t Ti substrate was immersed in 80% concentrated hot sulfuric acid for 10 minutes, for acid pickling, washed by water and dried. This plate was set in a DC magnetron sputtering device, and evacuation was effected to reach a predetermined vacuum degree. Argon gas was introduced. The Ti substrate was cleaned on the surface by reverse sputtering, and regular sputtering was carried out at an argon gas pressure of $1 \times 10^{-3}$ torr, using Ta as the target material and applying an energy of 8 w/cm$^2$, for controlling the sputtering time, to form a 3 μm thick Ta-sputtered film as an intermediate layer on the surface of Ti substrate. The surface was coated with a butanol solution of chloro-iridic acid, and dried in a 100° C. drying furnace for 15 minutes, and inserted into a furnace of 450° C., to be baked in an oxidative atmosphere for 10 minutes. This was repeated 10 times, to have 30 g/m$^2$ as Ir metal on the surface. Finally, it was baked in a 450° C. furnace for 1 hour, to prepare a sample.

For comparison, a sample without the intermediate layer, and a sample with a Ti-sputtered film as the intermediate layer were prepared in the same way. Furthermore, a sample with the active layer carried in the same way on Ta substrate was also prepared. The electrode structures of these samples are shown in Table 1.

TABLE 1

| Sample No. | Active layer | Intermediate layer | Electrode substrate | Possible electrolyzing time |
|---|---|---|---|---|
| No. 1 | IrO$_2$ (30 g/m$^2$) | 3 μm Ta-sputtered film | Ti substrate | 8000 hours or more |
| No. 2 | IrO$_2$ (30 g/m$^2$) | | Ta sustrate | 30 hours |
| No. 3 | IrO$_2$ (30 g/m$^2$) | 3 μm Ti sputtered film | Ti substrate | 1100 hours |
| No. 4 | IrO$_2$ (30 g/m$^2$) | | Ti substrate | 800 hours |

Figure 5:
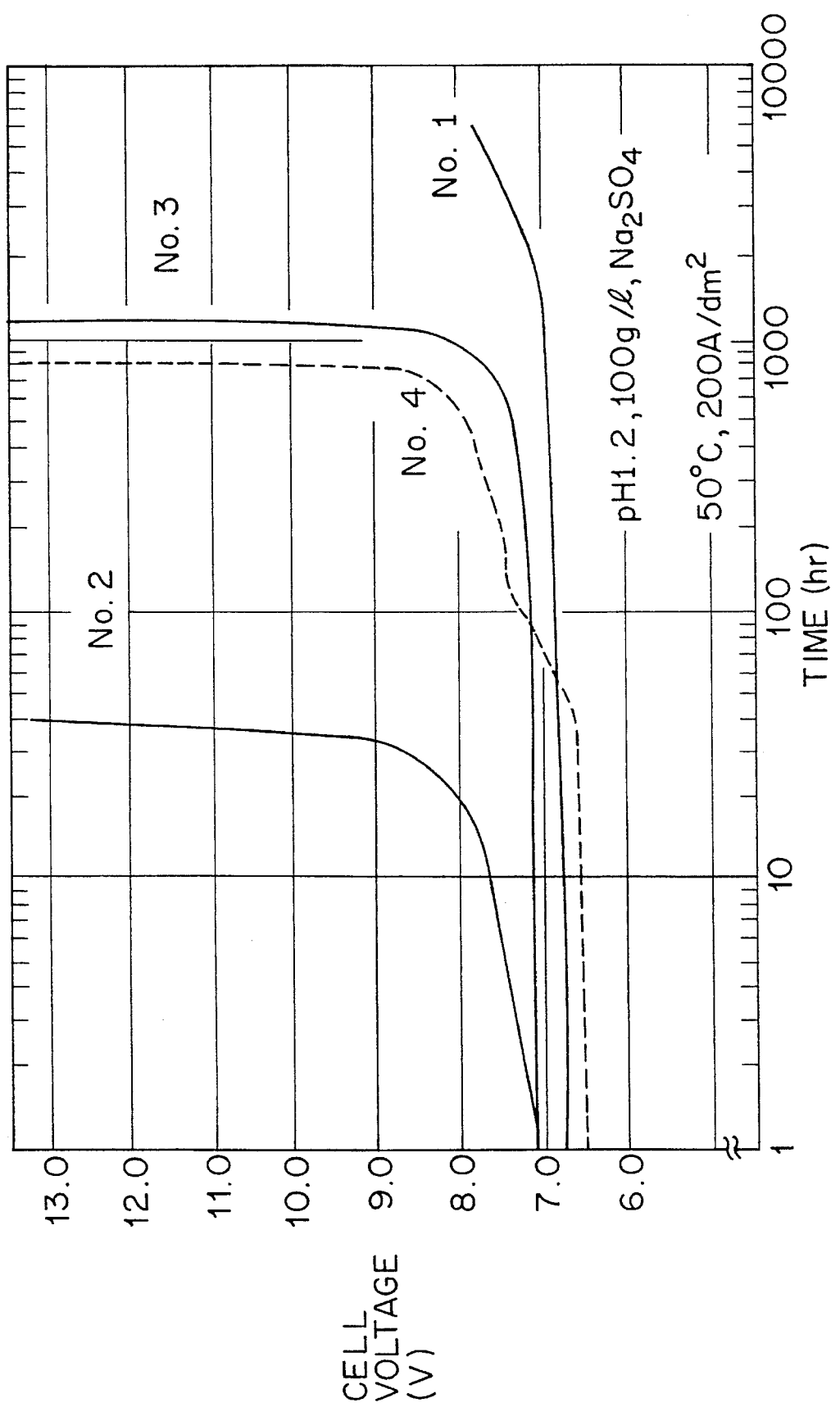
FIG. 5. A figure showing the changes of cell voltage over time, measured when Nos. 1 to 4 electrode samples were used in continuous electrolysis at a current density of 200 A/dm$^2$ in pH 1.2 50° C. 100 g/l sodium sulfate aqueous solution.

To compare their performance, durability tests were conducted. In the tests, the electrodes shown in Table 1 were respectively used in a pH 1.2 50° C. electrolyte containing 100 g/l of sodium sulfate for continuous electrolysis at 200 A/dm$^2$(2A/cm$^2$). The respective electrolytic cells changed in voltage with the lapse of time as shown in FIG. 5.

In the comparison of No. 1 electrode with Nos. 1 to 3 electrodes, No. 1 electrode allowed stable electrolysis even after a lapse of 6000 hours, but the other electrodes became unable to sustain electrolysis sooner or later, due to the insulation achieved by the growth of oxide at the interface between the active layer and the substrate even though more than 80% of iridium remained on the surface. It is especially to be noted that the No. 2 electrode made the electrolytic cell voltage rise extremely in only 30 hours, not allowing electrolysis. In the comparison between Nos. 1 and 2 electrodes, a large difference is shown between Ta as a sputtered film and Ta of bulk metal prepared through ordinary melting and solidification, and this is an important effect leading to the accomplishment of the present invention.

As described before, when an active material such as iridium oxide is caused to be carried, the thermal decomposition method is used to make it carried on the surface of a metal base. It is known that the temperature of the heat treatment effected in this case is about 350° to 550° C. This relates to the excellent performance shown by the electrode of the present invention. The temperature of the heat treatment effected to make the active material carried causes the crystal structure of the Ta-sputtered film used as the intermediate layer to be changed from thermodynamically metastable β phase to thermodynamically stable α phase, and this change causes the active material carried on the surface to be diffused into the intermediate layer to form Ta-Ir alloy at the interface. The electrode of the present invention using the intermediate Ta-sputtered layer containing β phase has a structure, to state in detail, of iridium oxide/ Ir-diffused layer/intermediate Ta-sputtered layer/Ti substrate. Therefore, in the electrolysis at a high current density in sulfuric acid aqueous solution, the growth of tantalum oxides at the interface is hard to occur.

The reason why No. 2 electrode in Table 1 becomes unable to sustain electrolysis in a far shorter period of time on the contrary even though the same Ta is used immediately below the active material is that the base Ta is of thermodynamically stable α phase, and so does not cause any structural change when the active material is caused to be carried, and that a layer with the active material diffused cannot be formed unlike the present invention.

On the other hand, the relation between No. 3 electrode of Table 1 using a Ti-sputtered film as the intermediate layer and No. 4 electrode not using it is the same as the relation between Nos. 1 and 2 electrodes. Even though the same Ti is used immediately below the active material, the Ti-sputtered film and the bulk metal Ti are different in effect. However, the difference in durability between Nos. 3 and 4 electrodes is not so large as observed with Ta. The reason is that the Ti-sputtered film and the bulk metal Ti are the same in crystal structure, being of thermodynamically stable hcp structure, and that the structural change as observed with Ta is not caused. A certain effect was observed when the Ti-sputtered film was used as the intermediate layer, because of the physical form effect of the sputtered film. An ordinary sputtered film is obtained as an aggregate of columnar precipitates. If an active electrode material is carried on the surface with this crystal form, the active material fills the clearances between columns, to achieve an anchoring effect, and the adhesion between the active material and the Ti-sputtered film becomes more excellent than that in a bulk metal Ti base electrode. This effect is a difference between Nos. 3 and 4 electrodes.

Example 2

The surface of 120×200×2t Ti substrate was immersed in 80% concentrated hot sulfuric acid for 10 minutes, for acid pickling, washed by water and dried. This plate was set in a DC magnetron sputtering device, and evacuation was effected to reach a predetermined vacuum degree. Argon gas was introduced. The Ti substrate was washed on the surface by reverse sputtering, and regular sputtering was effected at an argon gas pressure of $1 \times 10^{-3}$ torr, using Ta as the target material and applying an energy of 8 w/cm$^2$ to the target, to control the sputtering time. In this way, a 0.3 μm, 1 μm or 3 μm thick Ta-sputtered film was formed on the surface of Ti substrate. Then, it was coated with a butanol solution with chloroiridic acid and tantalum butoxide dissolved at a molar ratio of Ir:Ta=7:3 as metals, dried in a 100° C. drying furnace for 15 minutes, and inserted into a 450° C. furnace, to be baked in an oxidative atomosphere for 10 minutes. This was repeated 10 times, to have 30 g/m$^2$ as Ir and Ta metals on the surface. Finally, it was baked in a 450° C. furnace for 1 hour. Thus, three sample were prepared. For comparison, an electrode with the same active electrode material carried by Ti substrate was also prepared.

The electrode structures of these samples are shown in Table 2.

TABLE 2

| Sample No. | Electrode structure | |
|---|---|---|
| No. 5 | $IrO_2$—$Ta_2O_5$ | (Ir:Ta = 7:3, 30 g/m*)/0.3 μm Ta-sputtered film/Ti substrate |
| No. 6 | $IrO_2$—$Ta_2O_5$ | (Ir:Ta = 7:3, 30 g/m*)/1 μm Ta-sputtered film/Ti substrate |
| No. 7 | $IrO_2$—$Ta_2O_5$ | (Ir:Ta = 7:3, 30 g/m*)/3 μm Ta-suputtered film/Ti substrate |
| No. 8 | $IrO_2$—$Ta_2O_5$ | (Ir:Ta = 7:3, 30 g/m*) Ti substrate |

*30 g/$^2$ is an amount carried as total of Ir and Ta metals.

Figure 6:
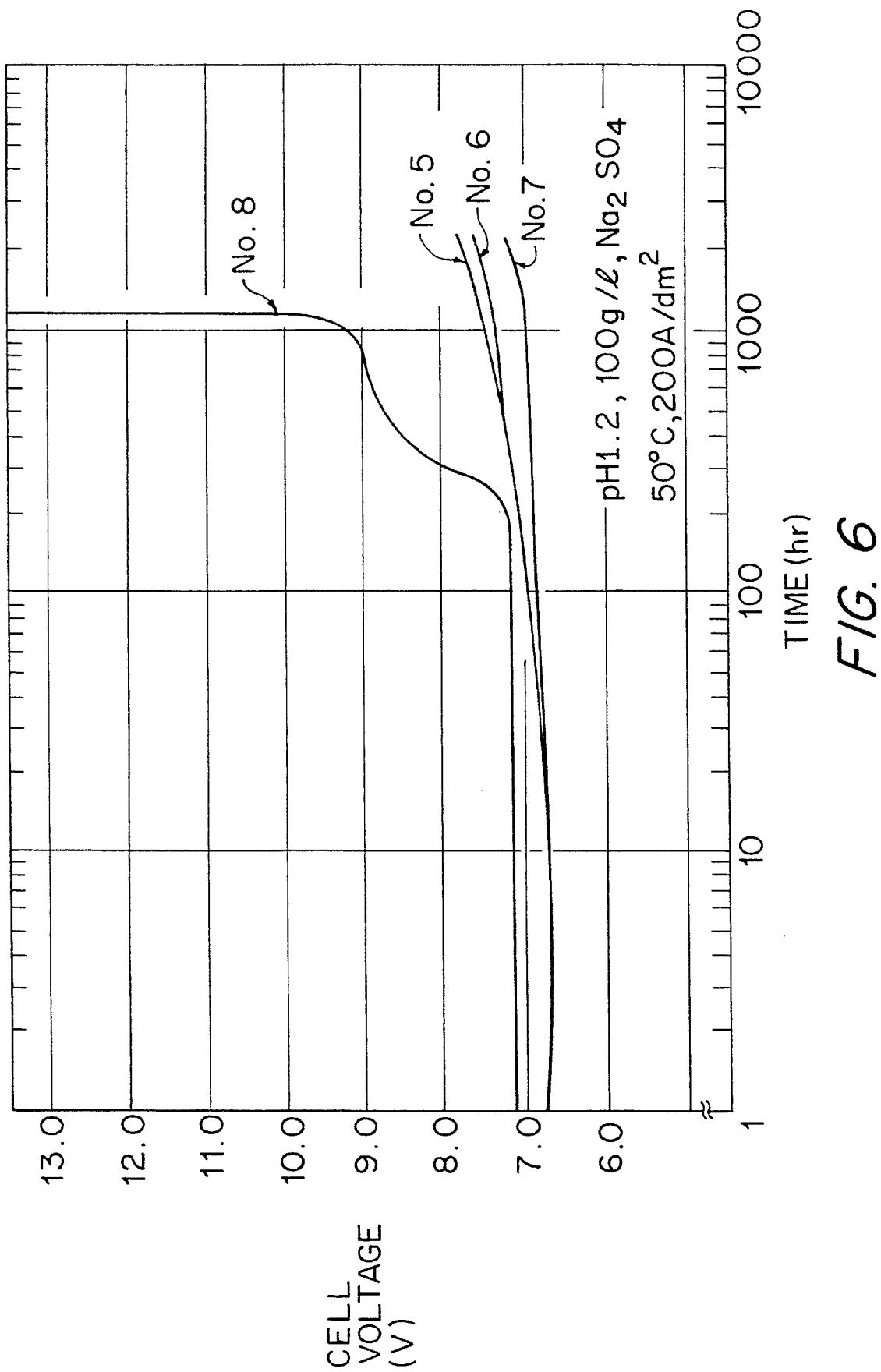
FIG. 6. A figure showing the changes of cell voltage over time, measured when Nos. 5 to 8 electrode samples were used in continuous electrolysis at a current density of 200 A/dm$^2$ in pH 1.2 50° C. 100 g/l sodium sulfate aqueous solution.
Figure 7:
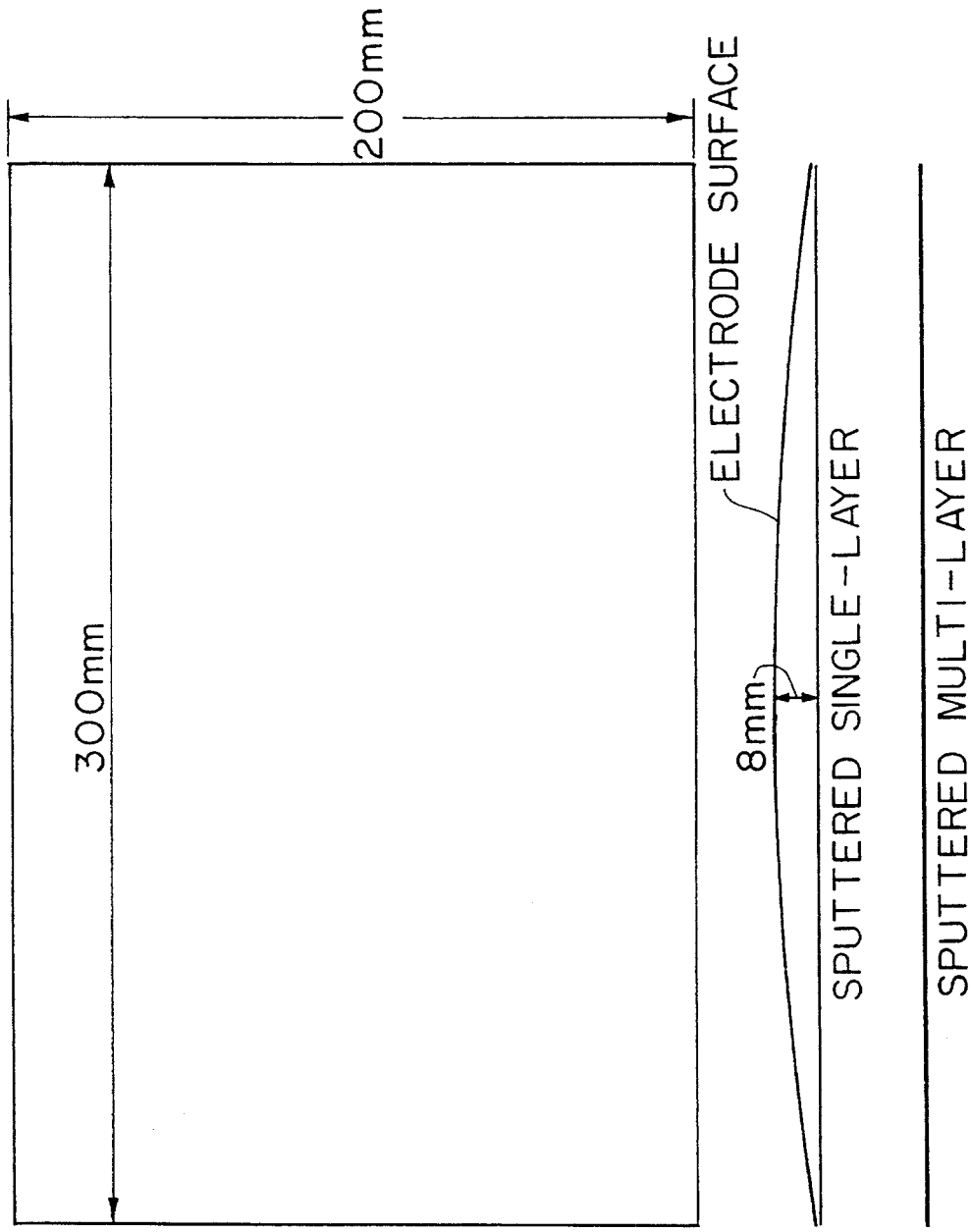
FIG. 7. A plan view and side views showing the difference in strain of the electrodes prepared using a sputtered single-layer film or a sputtered multi-layer film.

To compare their performance, durability tests were conducted as done in Example 2, and the results are shown in FIG. 6. Samples Nos. 5–7 with a Ta-sputtered film as the intermediate layer based on the present invention did not show any sharp voltage rise, and allowed stable electrolysis even after a lapse of 2500 hours.

Example 3

The surface of 120×200×2t Ti substrate was immersed in 80% concentrated hot sulfuric acid for 10 minutes, for acid pickling, washed by water and dried. This plate was set in a DC magnetron sputtering device, and evacuation was effected to reach a predetermined vacuum degree. Argon gas was introduced. The Ti substrate was cleaned on the surface by reverse sputtering, and regular sputtering was effected at an argon gas pressure of 1×10$^{-3}$ torr, using Ta as the target material and applying an energy of 8 W/cm$^2$ to the target, to control the sputtering time, for forming a 6 μm thick Ta-sputtered film as the intermediate layer on the surface of Ti substrate. It was coated with a butanol solution of chloroiridic acid, dried in a 100° C. drying furnace for 15 minutes, and inserted into a 450° C. furnace, to be baked in an oxidative atomosphere for 10 minutes. This was repeated 10 times, to have 30 g/m$^2$ as Ir metal on the surface. Finally, it was baked in a 450° C. furnace for 1 hour, to prepare a sample.

The electrode was subjected to a more severe durability test at a high current density of 400 A/dm$^2$. The electrolysis was effected using the same pH 1.2 50° C. 100 g/l sodium sulfate solution. As a result, even if electrolysis was effected for more than 3500 hours, the cell voltage did not show any large change, and the consumption of iridium on the surface was as slight as 3.6% very excellently.

Example 4

The surface of 300×200×2t Ti substrate was immersed in 80% concentrated hot sulfuric acid for 10 minutes, for acid pickling, washed by water and dried. This plate was set in a DC magnetron sputtering device, and evacuation was effected to reach a predetermined vacuum degree. Argon gas was introduced. The Ti substrate was cleaned on the surface by reverse sputtering, and regular sputtering was effected at an argon gas pressure of 1×10$^{-3}$ torr, using a 5 inch ×18 inch Ta target and applying an energy of 3.57 W/cm$^2$ to the target. With the distance between the Ti substrate and the target kept at 60 mm, the Ti substrate was moved in parallel to the target, to form a Ta-sputtered film on the surface of Ti substrate. In this case, a 3 μm Ta-sputtered single-layer film was formed by one time of movement and a 3 μm Ta-sputtered multi-layer film was formed by ten times of movement with a 0.3 μm thick layer formed each time. Iridium oxide was caused to be carried on these surfaces by 20 g/m$^2$ as metal. The operation to make iridium oxide carried was as done in the examples described so far.

The single-layer film and the multi-layer film were not so greatly different in the strain immediately after completion of sputtering and were almost flat. Their crystal structures were of a mixed phase of α+β as shown in FIG. 1. However, the heat treatment to make iridium oxide carried made the single-layer film strained by about 8 mm at the center as shown in FIG. 6, but made the multi-layer film strained only by less than 1 mm.

The electrodes of the present invention show excellent durability in the electrolysis in sulfate bath electrolytes at high current densities, and also show excellent durability in severe environments containing, for example, a fluoride in which the conventional Ti base electrodes cannot be used. Also in various anode reactions other than those in sulfate bath electrolytes, the electrodes show excellent performance, needless to say, and also in environments liable to cause oxygen evolution of side reaction due to dilute chlorine ions, for example, sea water electrolysis, they show excellent performance.

We claim:

1. In an electrolysis electrode comprising a Ti substrate having a platinum group metal oxide layer, the improvement wherein the electrode comprises an intermediate Ta-containing layer interposed between the platinum group metal oxide layer and the Ti substrate, the Ta-containing layer comprising thermodynamically stable crystalline α phase Ta and having at its interface with the metal oxide layer a content of a platinum group metal, where the durability of the electrode is increased.

2. An improved electrode according to claim 1 wherein said intermediate Ta layer is a sputtered Ta layer.

3. An improved electrode according to claim 1 wherein the platinum group metal of said interface comprises Ir.

4. An improved electrode according to claim 1 wherein the α phase Ta in said intermediate layer is formed by heat treatment which transforms β phase Ta to α phase Ta.

5. An electrode according to claim 4 wherein said intermediate Ta-containing layer is a sputtered Ta layer.

6. In a process of preparing an electrolysis electrode comprising a platinum group metal oxide coated Ti substrate in which a layer of an active electrode material comprising an oxide of a platinum group metal is provided on a Ti substrate by heat treatment, wherein the improvement comprises, prior to the heat treatment, of providing on the Ti substrate a metal layer comprising metastable crystalline β phase Ta and wherein said heat treatment is effected at a temperature which causes a platinum group metal to diffuse into the metal layer at its interface with the layer of active electrode material and to cause the β crystalline phase Ta to be transformed into thermodynamically stable crystalline α phase Ta, where the durability of the electrode is increased.

7. A process according to claim 6 wherein the β phase Ta layer is provided on said Ti substrate by sputtering.

8. A process according to claim 6 further comprising acid treating the Ti substrate to impart a finely undulating surface thereon prior to providing said β phase Ta-containing metal layer on said substrate.

* * * * *